United States Patent
Huang

(10) Patent No.: US 10,992,896 B2
(45) Date of Patent: Apr. 27, 2021

(54) IMAGE SENSOR AND SEMICONDUCTOR STRUCTURE

(71) Applicant: SHENZHEN GOODIX TECHNOLOGY CO., LTD., Guangdong (CN)

(72) Inventor: Hsin Yuan Huang, Taipei (TW)

(73) Assignee: SHENZHEN GOODIX TECHNOLOGY CO., LTD., Guangdong (CN)

(*) Notice: Subject to any disclaimer, the term of this patent is extended or adjusted under 35 U.S.C. 154(b) by 126 days.

(21) Appl. No.: 16/371,768

(22) Filed: Apr. 1, 2019

(65) Prior Publication Data
US 2020/0112699 A1 Apr. 9, 2020

Related U.S. Application Data

(60) Provisional application No. 62/743,268, filed on Oct. 9, 2018.

(51) Int. Cl.
*H04N 5/378* (2011.01)
*H01L 27/146* (2006.01)
*H04N 5/3745* (2011.01)

(52) U.S. Cl.
CPC ....... *H04N 5/378* (2013.01); *H01L 27/14634* (2013.01); *H01L 27/14643* (2013.01); *H04N 5/37457* (2013.01)

(58) Field of Classification Search
CPC ........ H04N 5/378; H04N 5/379; H04N 5/369; H04N 5/3575; H04N 5/3745; H04N 5/37457
See application file for complete search history.

(56) References Cited

U.S. PATENT DOCUMENTS

2013/0107093 A1* 5/2013 Aoki ............. H04N 5/379
348/302
2014/0226047 A1 8/2014 Lahav et al.
(Continued)

FOREIGN PATENT DOCUMENTS

CN 103905748 A 7/2014
CN 104092963 A 10/2014
(Continued)

OTHER PUBLICATIONS

English abstract translation of CN103905748A.
(Continued)

*Primary Examiner* — Thanh Luu
*Assistant Examiner* — Monica T Taba
(74) *Attorney, Agent, or Firm* — WPAT, P.C., Intellectual Property Attorneys; Anthony King

(57) ABSTRACT

An image sensor is disclosed. The image sensor includes: a pixel circuit in a first die, the pixel circuit including a pixel for sensing an incident light to generate a result; and a correlated double sampling (CDS) readout circuit in a second die different from the first die; wherein the first die is coupled to the second die, and the result sensed by the pixel circuit is read out by the CDS readout circuit. A semiconductor structure is also disclosed. The semiconductor structure includes: said image sensor, wherein the first die is stacked on the second die; and an interconnector between the first die and the second die, the interconnector electrically connecting the pixel circuit and the CDS readout circuit.

11 Claims, 4 Drawing Sheets

(56) References Cited

U.S. PATENT DOCUMENTS

| | | | |
|---|---|---|---|
| 2015/0062395 A1 | 3/2015 | Ono et al. | |
| 2016/0234451 A1* | 8/2016 | Otaka | H04N 5/37457 |
| 2017/0155864 A1 | 6/2017 | Ueno et al. | |
| 2018/0227513 A1 | 8/2018 | Keung et al. | |
| 2018/0227516 A1* | 8/2018 | Mo | H04N 5/378 |

FOREIGN PATENT DOCUMENTS

| | | |
|---|---|---|
| CN | 107437552 A | 12/2017 |
| CN | 108200367 A | 6/2018 |
| CN | 108401497 A | 8/2018 |
| CN | 108447881 A | 8/2018 |
| JP | 2010093548 A | 4/2010 |
| WO | 2018109821 A1 | 6/2018 |

OTHER PUBLICATIONS

English abstract translation of CN104092963A.
English abstract translation of CN108447881A.
English abstract translation of CN107437552A.
English abstract translation of CN108200367A.
English abstract translation of CN108401497A.
English abstract translation of JP2010093548A.

* cited by examiner

IMAGE SENSOR AND SEMICONDUCTOR STRUCTURE

CROSS REFERENCE TO RELATED APPLICATIONS

This application claims the benefit of U.S. provisional application 62/743,268, filed on Oct. 9, 2018, which is incorporated by reference in its entirety.

TECHNICAL FIELD

The present disclosure relates to an image sensor and, more particularly, to a global shutter image sensor in a 3D IC.

BACKGROUND

A CMOS image sensor with global shutter exposure is widely used to catch fast moving objects without distortion. Compared to the rolling shutter images, image sensors with a global shutter allow all of the pixels to accumulate a charge with the exposure starting and ending at the same time. In other words, all pixels in a global shutter image sensor integrate light simultaneously. At the end of the exposure time the charge is read out simultaneously. In turn, the image has no motion blur on moving objects. This is given the exposure is short enough to stop pixel blur.

However, the global shutter image sensor is more complicated and consumes more area compared to the rolling shutter image. For example, additional global reset transistor, global charge transfer transistor and charge storage capacitor are added to perform global reset, global charge transfer and signal storage respectively. Inevitably, extra devices reduce the fill factor and a dilemma arises.

SUMMARY OF THE INVENTION

Therefore, a main object of some embodiments of the present disclosure is to provide a global shutter image sensor in a 3D IC to solve the above mentioned issues.

Some embodiments of the present disclosure provide an image sensor. The image sensor includes a pixel circuit in a first die, the pixel circuit including a pixel for sensing an incident light to generate a result; and a correlated double sampling (CDS) readout circuit in a second die different from the first die; wherein the first die is coupled to the second die, and the result sensed by the pixel circuit is read out by the CDS readout circuit.

Some embodiments of the present disclosure provide a semiconductor structure. The semiconductor structure includes: the above image sensor, wherein the first die is stacked on the second die; and an interconnector between the first die and the second die, the interconnector electrically connecting the global shutter pixel circuit and the CDS readout circuit.

Some embodiments of the present disclosure provide a method of operating the above image sensor. The method includes: at a first phase, resetting the pixel of the pixel circuit in the first die and then sensing the incident light to generate a result; and at a second phase, reading the result through the CDS readout circuit in the second die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
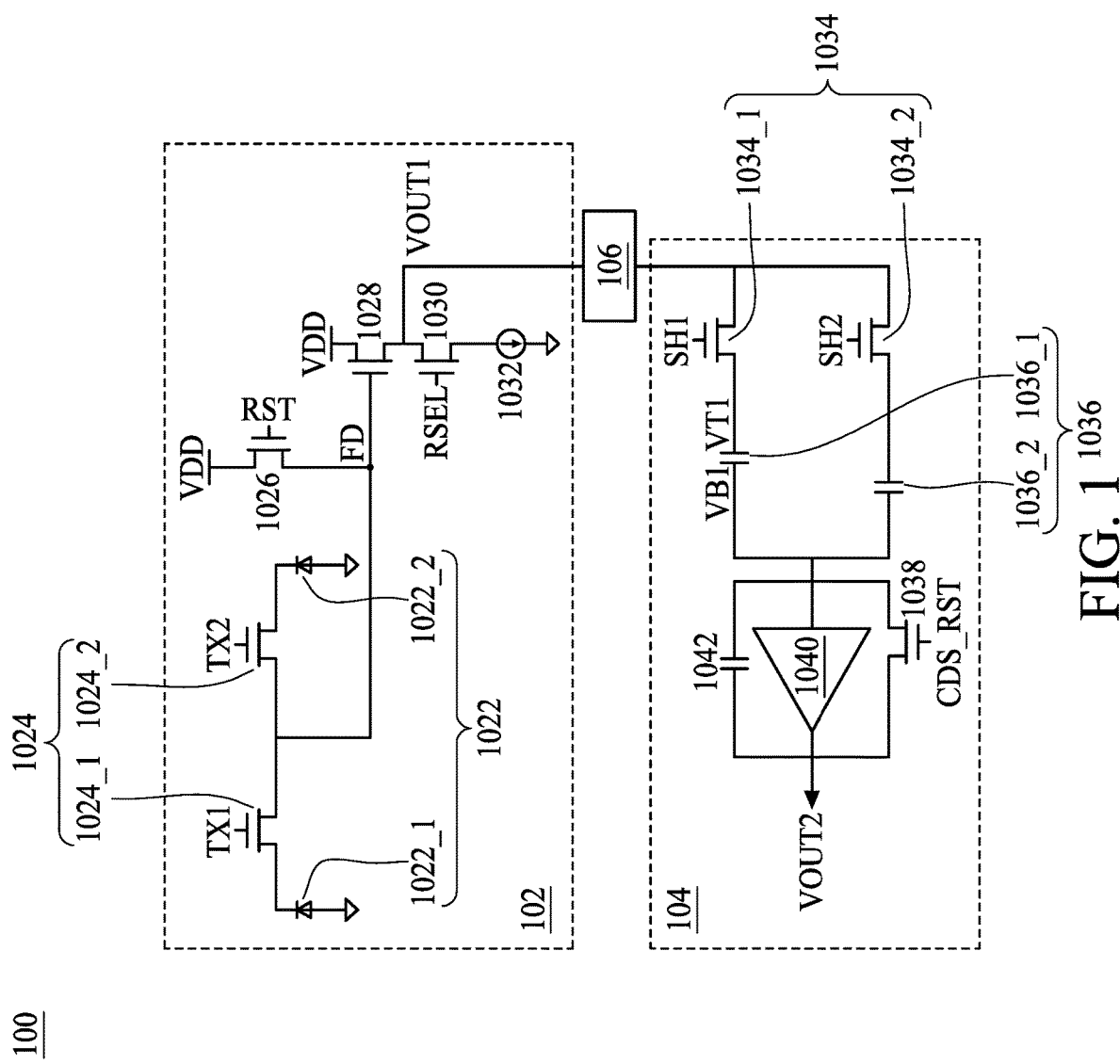
FIG. 1 is a diagram illustrating a semiconductor structure according to a first embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Image sensors with a global shutter allow all of the pixels to accumulate a charge with the exposure starting and ending at the same time. In other words, all pixels in a global shutter image sensor integrate light simultaneously. At the end of the exposure time the charge is read out simultaneously. In turn, the image has no motion blur on moving objects. This is given the exposure is short enough to stop pixel blur.

Existing rolling shutter image sensor with shared pixel, such as four-transistor ("4T") pixels, without having storage nodes is hard to perform a global shutter function. That is because charge in each pinned-photodiode ("PD") regions needs to be read out one by one instead of read out simultaneously. Image sensors with a global shutter normally are more complicated than rolling shutter image sensors. Also, dimension of each pixel of the global shutter image sensors are greater than that of the rolling shutter image sensors. Therefore, a fill factor of the global shutter image sensors is poor compared to the rolling shutter image sensors.

FIG. 1 is a diagram illustrating a semiconductor structure according to a first embodiment of the present disclosure. In FIG. 1, the semiconductor structure 100 includes a first die 102 and a second die 104. The first die 102 is stacked on the second die 104. Both of the first die 102 and the second die 104 have semiconductor devices formed therein. An interconnector 106 is formed between the first die and the second die for electrically connecting semiconductor devices in the first die 102 and the semiconductor devices in the second die 104. For instance, the interconnector 106 includes micro bumps. The first die 102 is therefore electrically interconnected to the second die 104, and the first die 102 and the second die 104 together form a 3D IC and are able to perform a function of an image sensor.

The first die 102 includes a global shutter pixel circuit, including a pixel 1022, a plurality of transfer transistors 1024, a first reset select transistor 1026, a source follower transistor 1028 and a row select transistor 1030. In this embodiment, the pixel 1022 is a two-shared pixel including a first photodiode 1022_1 and a second photodiode 1022_2. However, this is not a limitation of the present disclosure. The plurality of transfer transistors 1024 includes a first transfer transistor 1024_1 and a second transfer transistor 1024_2. The first transfer transistor 1024_1 is coupled between the first photodiode 1022_1 and a floating diffusion region FD for gating between the first photodiode 1022_1 and the floating diffusion region FD. The second transfer transistor 1024_2 is coupled between the second photodiode 1022_2 and the floating diffusion region FD for gating between the second photodiode 1022_2 and the floating diffusion region FD. As shown in FIG. 1, a gate terminal of the first transfer transistor 1024_1 is coupled to a signal TX1, and a gate terminal of the second transfer transistor 1024_2 is coupled to a signal TX2.

The first reset select transistor 1026 is coupled between the floating diffusion region FD and a supply voltage VDD. In this embodiment, a drain terminal of the first reset select transistor 1026 is coupled to the supply voltage VDD, a source terminal of the first reset select transistor 1026 is coupled to the floating diffusion region FD, and a gate terminal of the first reset select transistor 1026 is coupled to a signal RST. A gate terminal of the source follower transistor 1028 is coupled to the floating diffusion region FD, and a drain terminal of the source follower transistor 1028 is coupled to the supply voltage VDD. The source follower 1028 is shared by the first photodiode 1022_1 and the second photodiode 1022_2. The source follower 1028 is operable to receive electrical signal from the floating diffusion region FD. Specifically, the source follower 1028 receives the supply voltage VDD to generate the pixel output voltage VSIG_PIX at a source terminal of the source follower transistor 1028 based on the amount of charge stored by the floating diffusion region FD. The row select transistor 1030 selectively reads out the output terminal VOUT1 from the source follower 1028 to the second die 104 through the interconnector 106.

The second die 104 includes a correlated double sampling (CDS) readout circuit, including a plurality of sample hold transistors 1034, a plurality of storage capacitors 1036, a second reset select transistor 1038 and an amplifier 1040. Since the pixel 1022 is a two-shared pixel, the plurality of sample hold transistors 1034 include a first sample hold transistor 1034_1 and a second sample hold transistor 1034_2 corresponding to the first photodiode 1022_1 and the second photodiode 1022_2 respectively. The storage capacitors 1036 include a first storage capacitor 1036_1 and a second storage capacitor 1036_2 corresponding to the first photodiode 1022_1 and the second photodiode 1022_2 respectively. The first storage capacitor 1036_1 has a capacitance of CS1 and the second storage capacitor 1036_2 has a capacitance of CS2. A drain terminal of the first sample hold transistor 1034_1 and a drain terminal of the second sample hold transistor 1034_2 receive the output terminal VOUT1 through the interconnector 106. A gate terminal of the first sample hold transistor 1034_1 is coupled to a signal SH1, and a gate terminal of the second sample hold transistor 1034_2 is coupled to a signal SH2.

The amplifier 1040 is shared by the first storage capacitor 1036_1 and the second storage capacitor 1036_2. The first storage capacitor 1036_1 is coupled between a source terminal of the first sample hold transistor 1034_1 and the amplifier 1040, and the second storage capacitor 1036_2 is coupled between a source terminal of the second sample hold transistor 1034_2 and the amplifier 1040. By using the storage capacitors 1036, the second die 104 is able to perform the CDS function and output from the amplifier 1040 as an output terminal VOUT2. Source/drain terminals of the second reset select transistor 1038 are coupled to an input terminal and an output terminal of the amplifier 1040 respectively. A gate terminal of the second reset select transistor 1038 is coupled to a signal CDS_RST. In some embodiments, another capacitor 1042 may be further provided to configure an equivalent gain at the output terminal of the amplifier 1040. The capacitor 1042 has a capacitance CF. Two terminals of the capacitor 1042 are coupled to the input terminal and the output terminal of the amplifier 1040 respectively. The global shutter pixel circuit of the first die 102 and the CDS readout circuit of the second die 104 commonly form an image sensor and details of operations of the image sensor are provided below.

The concept of the present disclosure is to separate the semiconductor structure 100 into the global shutter pixel circuit and the CDS readout circuit, and to arrange the global shutter pixel circuit and the CDS readout circuit into the first die 102 and the second die 104 respectively. The pixel circuit of the first die 102 is for sensing an incident light to generate a result to the CDS readout circuit of the second die 104. In other words, a size of each pixel of the pixel circuit in the first die 102 can be reduced since the CDS readout circuit is at the second die 104 and no longer occupies area of the first die 102. The density of pixels in the pixel circuit can be improved; therefore a higher fill factor is obtained.

Figure 2:
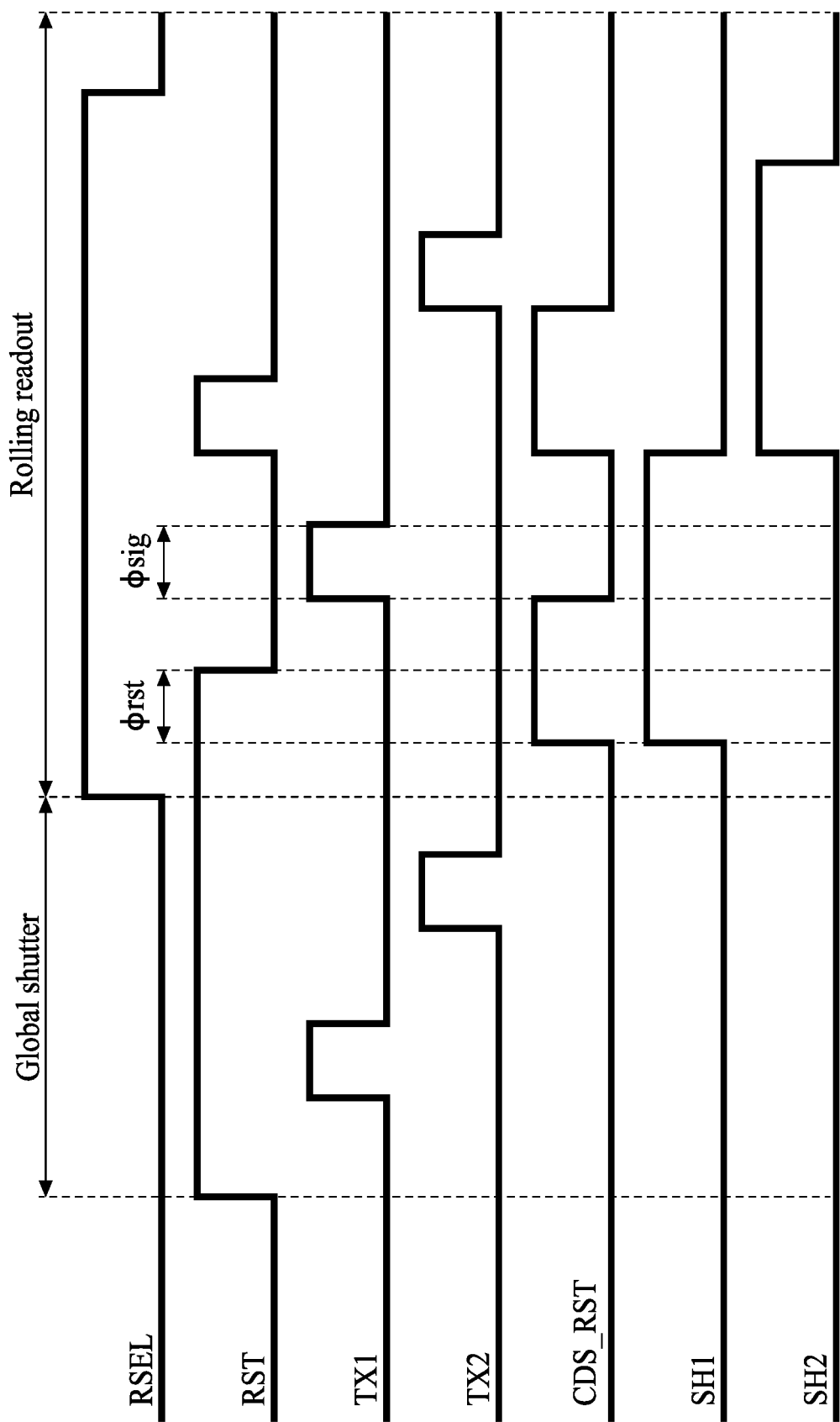
FIG. 2 is a timing diagram illustrating operations of the image sensor of FIG. 1 according to the first embodiment of the present disclosure.

FIG. 2 is a timing diagram illustrating operations of the image sensor of FIG. 1 according to the first embodiment of the present disclosure. The operations of the image sensor include a global shutter phase and a rolling readout phase. At the global shutter phase, the signal RST is asserted first and then the first photodiode 1022_1 and the second photodiode 1022_2 are sequentially reset through signals TX1 and TX2 respectively. After the first photodiode 1022_1 and the second photodiode 1022_2 are reset, the signals TX1 and TX2 are deasserted and the first photodiode 1022_1 and the second photodiode 1022_2 are allowed to sense image information. After that, the image sensor enters the rolling readout phase. At the rolling readout phase, the first photodiode 1022_1 and the second photodiode 1022_2 are readout sequentially.

Each of the first photodiode 1022_1 and the second photodiode 1022_2 is readout through a Φrst phase and a Φsig phase. Take the first storage capacitor 1036_1 for example, when reading out the first photodiode 1022_1, the signal SH1 is asserted. In particular, at the Φrst phase, the signals RST, CDR_RST and SH1 are asserted. A top plate voltage VT1 of the first storage capacitor 1036_1 becomes a reset voltage VRST_PIX through the output terminal VOUT1 of the first die 102 and the interconnector 106. A bottom plate voltage VB1 of the first storage capacitor 1036_1 becomes a reset voltage VREF_CDS obtained by asserting the signal CDS_RST.

At the Φsig phase, the signal RST is deasserted and the signal TX1 is asserted to allow the sensed image information to enter the floating diffusion region FD. The source follower 1028 receives electrical signal from the floating diffusion region FD and output the pixel output voltage VSIG_PIX to the top plate voltage VT1 of the first storage capacitor 1036_1 through the output terminal VOUT1 of the first die 102 and the interconnector 106. The top plate voltage VT1 of the first storage capacitor 1036_1 accordingly becomes the sensing voltage VSIG_PIX. The bottom plate voltage VB1 of the first storage capacitor 1036_1 then reflects a change of charge at the top plate voltage VT1 of the first storage capacitor 1036_1 by a voltage difference between a sensing voltage VSIG_PIX and the reset voltage VRST_PIX based on the reset voltage VREF_CDS, i.e. the bottom plate voltage VB1 becomes VSIG_PIX−VRST_PIX+VREF_CDS.

The gain of the amplifier 1040 is determined according to a ratio of the first storage capacitor 1036_1 and the capacitor 1042 coupled between the output terminal and the input terminal of the amplifier 1040. Therefore, the output terminal VOUT2 reflects a voltage of (VSIG_PIX−VRST_PIX+VREF_CDS)*(CS1/CF). After the first transfer transistor 1024_1 is readout, the second transfer transistor 1024_2 is readout through the second sample hold transistor 1034_2 in a similar way.

Figure 3:
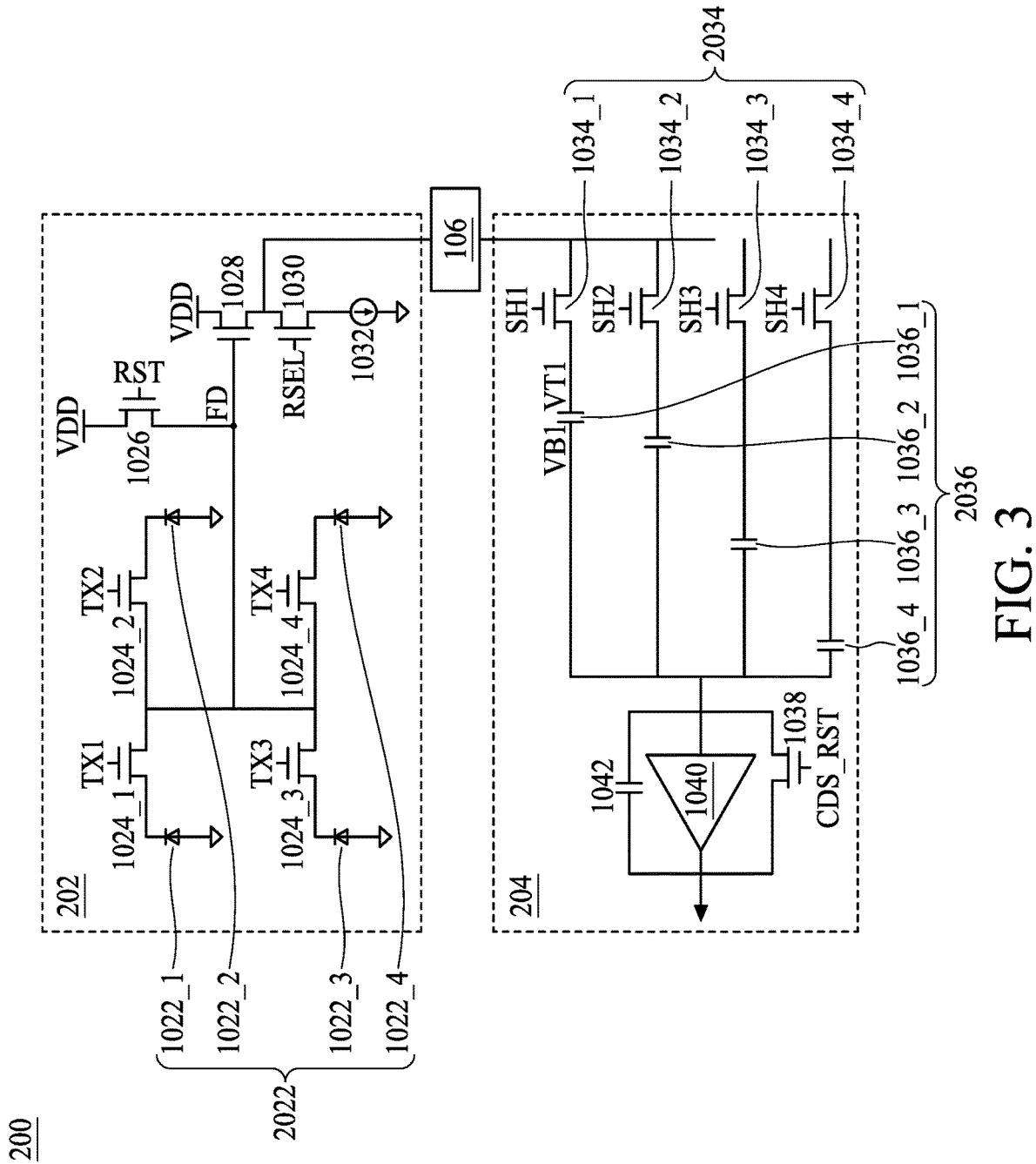
FIG. 3 is a diagram illustrating a semiconductor structure according to a second embodiment of the present disclosure.

The present disclosure is not limited to the two-shared pixel structure of FIG. 1. Other types of pixel structure that may apply to the aforementioned global shutter function and 3D IC structure should also be within the contemplated scope of the present disclosure. As a non-limiting example, FIG. 3 is a diagram illustrating a semiconductor structure according to a second embodiment of the present disclosure. FIG. 3 is similar to FIG. 1 except the global shutter pixel circuit included in a top die 202 is in a four-shared pixel structure. The CDS readout circuit included in a bottom die 204 is modified with respect to the four-shared pixel structure accordingly.

In particular, a pixel 2022 of the global shutter pixel circuit in the top die 202 is a four-shared pixel including the first photodiode 1022_1, the second photodiode 1022_2, a third photodiode 1022_3 and a fourth photodiode 1022_4. A plurality of sample hold transistors 2034 of the CDS readout circuit in the bottom die 204 includes the first sample hold transistor 1034_1, the second sample hold transistor 10342, a third sample hold transistor 1034_3 and a fourth sample hold transistor 1034_4 corresponding to the first photodiode 10221, the second photodiode 1022_2, the third photodiode 1022_3 and the fourth photodiode 1022_4 respectively. The storage capacitors 1036 of the CDS readout circuit in the bottom die 204 includes include the first storage capacitor 1036_1, the second storage capacitor 1036_2, the third storage capacitor 1036_3 and the fourth storage capacitor 1036_4 corresponding to the first photodiode 10221, the second photodiode 1022_2, the third photodiode 1022_3 and the fourth photodiode 1022_4 respectively.

Figure 4:
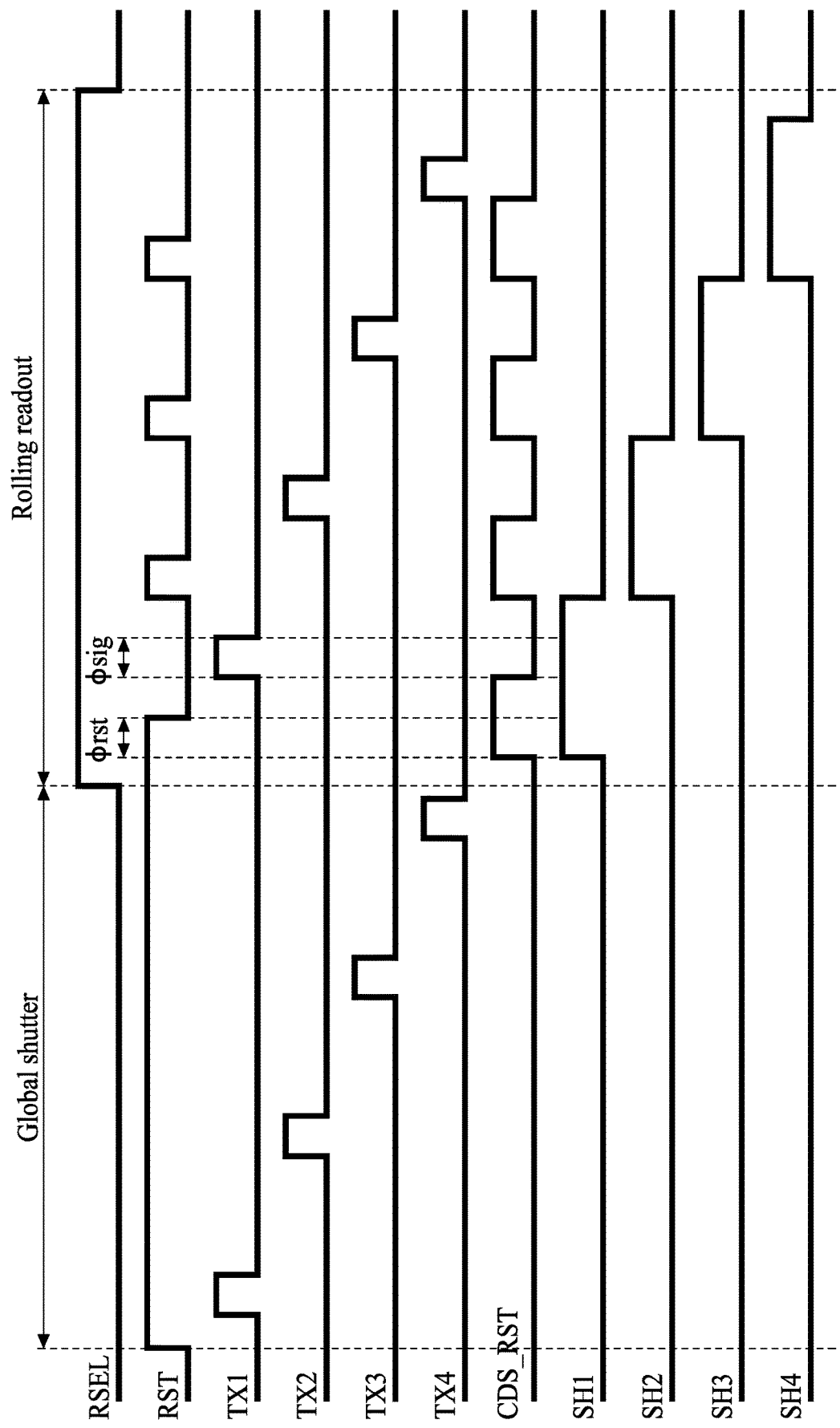
FIG. 4 is a timing diagram illustrating operations of the image sensor of FIG. 3 according to the second embodiment of the present disclosure.

FIG. 4 is a timing diagram illustrating operations of the image sensor of FIG. 3 according to the second embodiment of the present disclosure. At the global shutter phase, the first photodiode 1022_1, the second photodiode 1022_2, the third photodiode 1022_3 and the fourth photodiode 1022_4 are sequentially reset in a way similar to FIG. 3. After the first photodiode 1022_1, the second photodiode 1022_2, the third photodiode 1022_3 and the fourth photodiode 1022_4 are reset, the signals TX1, TX2, TX3 and TX4 are deasserted and the first photodiode 10221, the second photodiode 1022_2, the third photodiode 1022_3 and the fourth photodiode 1022_4 are allowed to sense image information. After that, the image sensor enters the rolling readout phase.

At the rolling readout phase, the first photodiode 10221, the second photodiode 1022_2, the third photodiode 1022_3 and the fourth photodiode 1022_4 are readout sequentially. Each of the first photodiode 10221, the second photodiode 1022_2, the third photodiode 1022_3 and the fourth photodiode 1022_4 is readout through the Φrst phase and the Φsig phase in a way similar to FIG. 3.

Some embodiments of the present disclosure provide an image sensor. The image sensor includes: a pixel circuit in a first die, the pixel circuit including a pixel for sensing an incident light to generate a result; and a correlated double sampling (CDS) readout circuit in a second die different from the first die; wherein the first die is coupled to the second die, and the result sensed by the pixel circuit is read out by the CDS readout circuit.

Some embodiments of the present disclosure provide a semiconductor structure. The semiconductor structure includes: said image sensor, wherein the first die is stacked on the second die; and an interconnector between the first die and the second die, the interconnector electrically connecting the pixel circuit and the CDS readout circuit.

Some embodiments of the present disclosure provide a method of operating the image sensor. The method includes: at a first phase, resetting the pixel of the pixel circuit in the first die and then sensing the incident light to generate a result; and at a second phase, reading the result through the CDS readout circuit in the second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a pixel circuit in a first die, the pixel circuit including a pixel for sensing an incident light to generate a result; and
a correlated double sampling (CDS) readout circuit in a second die different from the first die;
wherein the first die is coupled to the second die, and the result sensed by the pixel circuit is read out by the CDS readout circuit;
wherein the pixel includes a first photodiode and a second photodiode, and the pixel circuit further includes:
a first transfer transistor coupled between the first photodiode and a floating diffusion region for gating between the first photodiode and the floating diffusion region;
a second transfer transistor coupled between the second photodiode and the floating diffusion region for gating between the second photodiode and the floating diffusion region;
a first reset select transistor coupled between the floating diffusion region and a supply voltage;
a source follower transistor coupled to the floating diffusion region and to the supply voltage, the source follower transistor being operable to receive electrical signal from the floating diffusion region; and
a row select transistor coupled to the source follower transistor; and
wherein the CDS readout circuit includes:
a first sample hold transistor coupled to the source follower transistor, wherein the first sample hold transistor corresponding to the first photodiode;
a second sample hold transistor coupled to the source follower transistor, wherein the second sample hold transistor corresponding to the second photodiode;
a first storage capacitor coupled to the first sample hold transistor;
a second storage capacitor coupled to the second sample hold transistor;
an amplifier coupled to the first storage capacitor and the second storage capacitor; and
a second reset select transistor coupled between an input and an output of the amplifier;
wherein
at a first phase:
the pixel of the pixel circuit in the first die is reset, and
at a first reset sampling phase of a second phase:
the first reset select transistor, the second reset select transistor and the first sample hold transistor are turned on, and the first transfer transistor, the second transfer transistor and the second sample hold transistor are turned off for resetting a top plate voltage and a bottom plate voltage of the first storage capacitor; and
at a first signal sampling phase of the second phase:
the first transfer transistor and the first sample hold transistor are turned on, and the first reset select transistor, the second reset select transistor, the second sample hold transistor and the second transfer transistor are turned off for reading a first result sensed by the first photodiode.

2. The image sensor of claim 1, wherein the first die is stacked over the second die.

3. The image sensor of claim 1, wherein the first die has a first surface and a second surface, the second surface faces the second die, and the first surface faces the incident light.

4. The image sensor of claim 1, wherein the pixel is a shared pixel including a plurality of photodiodes.

5. The image sensor of claim 4, wherein the pixel is a two-shared pixel including two photodiodes.

6. The image sensor of claim 4, wherein the pixel is a four-shared pixel including four photodiodes.

7. A semiconductor structure, comprising:
an image sensor of claim 1, wherein the first die is stacked on the second die; and
an interconnector between the first die and the second die, the interconnector electrically connecting the pixel circuit and the CDS readout circuit.

8. The semiconductor structure of claim 7, wherein the interconnector includes micro bumps.

9. A method of operating the image sensor of claim 1, the method comprising:
at the first phase, resetting the pixel of the pixel circuit in the first die and then sensing the incident light to generate a result; and
at the second phase, reading the result through the CDS readout circuit in the second die.

10. The method of claim 9, wherein the pixel is a two-shared pixel including two photodiodes, and the resetting the pixel of the pixel circuit in the first die and then sensing the incident light to generate the result includes:
at the first phase, resetting the two photodiodes respectively and then sensing the incident light to generate the the first result and a second result.

11. The method of claim 10, the reading the result through the CDS readout circuit in the second die includes:
at the second phase, reading the first result and the second result through the CDS readout circuit in the second die.

* * * * *